United States Patent
Ball et al.

(10) Patent No.: US 6,861,345 B2
(45) Date of Patent: Mar. 1, 2005

(54) METHOD OF DISPOSING CONDUCTIVE BUMPS ONTO A SEMICONDUCTOR DEVICE

(75) Inventors: Michael B. Ball, Boise, ID (US); Chad A. Cobbley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 248 days.

(21) Appl. No.: 09/736,795

(22) Filed: Dec. 14, 2000

(65) Prior Publication Data

US 2001/0002044 A1 May 31, 2001

Related U.S. Application Data

(62) Division of application No. 09/385,584, filed on Aug. 27, 1999.

(51) Int. Cl.[7] .............................................. H01L 21/44
(52) U.S. Cl. ....................................................... 438/613
(58) Field of Search ................................ 438/597, 612, 438/613, 614, 615, 616, 617

(56) References Cited

U.S. PATENT DOCUMENTS

| | | | |
|---|---|---|---|
| 4,172,907 A | * | 10/1979 | Mones et al. ................ 438/759 |
| 4,763,829 A | * | 8/1988 | Sherry ...................... 228/124.1 |
| 4,922,321 A | | 5/1990 | Arai et al. |
| 5,246,880 A | | 9/1993 | Reele et al. |
| 5,361,695 A | | 11/1994 | Takagi et al. |
| 5,388,327 A | | 2/1995 | Trabucco |
| 5,442,852 A | | 8/1995 | Danner |
| 5,460,316 A | | 10/1995 | Hefele |
| 5,473,197 A | | 12/1995 | Idaka et al. |
| 5,492,235 A | | 2/1996 | Crafts et al. |
| 5,497,938 A | | 3/1996 | McMahon et al. |
| 5,504,277 A | | 4/1996 | Danner |
| 5,510,156 A | | 4/1996 | Zhao |
| 5,519,580 A | | 5/1996 | Natarajan et al. |
| 5,539,153 A | | 7/1996 | Schwiebert et al. |
| 5,565,033 A | | 10/1996 | Gaynes et al. |
| 5,586,715 A | * | 12/1996 | Schwiebert et al. ...... 228/248.1 |
| 5,587,342 A | * | 12/1996 | Lin et al. ...................... 438/125 |
| 5,593,080 A | | 1/1997 | Teshima et al. |
| 5,597,469 A | * | 1/1997 | Carey et al. ................. 205/118 |
| 5,600,180 A | | 2/1997 | Kusaka et al. |
| 5,637,832 A | | 6/1997 | Danner |
| 5,663,530 A | | 9/1997 | Schueller et al. |
| 5,672,542 A | | 9/1997 | Schwiebert et al. |
| 5,674,595 A | * | 10/1997 | Busacco et al. ............. 428/209 |
| 5,676,853 A | | 10/1997 | Alwan |
| 5,689,091 A | | 11/1997 | Hamzehdoost et al. |
| 5,717,252 A | | 2/1998 | Nakashima et al. |
| 5,735,452 A | | 4/1998 | Yu et al. |
| 5,741,624 A | | 4/1998 | Jeng et al. |
| 5,751,068 A | | 5/1998 | McMahon et al. |
| 5,787,580 A | | 8/1998 | Woo |
| 5,796,038 A | | 8/1998 | Manteghi |
| 5,811,184 A | | 9/1998 | Anderson et al. |
| 5,818,697 A | | 10/1998 | Armezzani et al. |
| 5,880,017 A | | 3/1999 | Schwiebert et al. |

FOREIGN PATENT DOCUMENTS

JP        6-177527    *  6/1994  ............ H05K/3/34

* cited by examiner

*Primary Examiner*—Evan Pert
(74) *Attorney, Agent, or Firm*—TraskBritt

(57) ABSTRACT

A method of forming conductive structures on the contact pads of a substrate, such as a semiconductor die or a printed circuit board. A solder mask is secured to an active surface of the substrate. Apertures through the solder mask are aligned with contact pads on the substrate. The apertures may be preformed or formed after a layer of the material of which the solder mask is comprised has been disposed on the substrate. Conductive material is disposed in and shaped by the apertures of the solder mask to form conductive structures in communication with the contact pads exposed to the apertures. Sides of the conductive structures are exposed through the solder mask, either by removing the solder mask from the substrate or by reducing the thickness of the solder mask. The present invention also includes semiconductor devices formed during different stages of the method of the present invention.

33 Claims, 3 Drawing Sheets

METHOD OF DISPOSING CONDUCTIVE BUMPS ONTO A SEMICONDUCTOR DEVICE

CROSS-REFERENCE TO RELATED APPLICATION

This application is a divisional of application Ser. No. 09/385,584, filed Aug. 27, 1999, pending.

BACKGROUND OF THE INVENTION

1. Field of the Invention

The present invention relates to methods of disposing conductive structures, such as solder bumps, onto the surfaces of semiconductor devices. In particular, the present invention relates to methods of employing solder masks made of dielectric materials to substantially simultaneously dispose a plurality of solder bumps onto a semiconductor device. More specifically, the present invention relates to conductive structure disposition methods wherein the dielectric solder mask is removable from the semiconductor device or may otherwise be altered during or subsequent to forming the conductive structures to expose the sides, or peripheries, of the conductive structures.

2. Background of Related Art

Conventionally, metal masks were used to selectively control the application of solder balls to the contact pads through which a semiconductor device would electrically communicate with other devices external thereto. Metal masks have typically been made from molybdenum, which exhibits long-term dimensional stability at high temperature and may be reused.

Dry films have also been used as solder masks. Dry films, which are typically a thin layer of semisolid material that is disposed on a carrier film, may be laminated to the surface of a substrate, such as a printed circuit board ("PCB"), by heat and vacuum lamination processes. The dry film may then be patterned by exposing selected regions to ultraviolet ("UV") light, which hardens the regions of the dry film that are to remain and be used as the solder mask. The uncured regions are removed from the substrate by use of a suitable solvent, such as 1,1,1,-trichloroethane, and the remaining portions of the dry film cured by heat or high-energy UV irradiation.

In addition to metal solder masks and dry films, polymers, such as acrylates and epoxies, have also been used as masks for applying solder to semiconductor device substrates, such as printed circuit boards and bare semiconductor devices. Polymers are typically applied to the surface of the substrate, patterned to expose the contact pads of the substrate through the polymer, and cured. Polymers may be applied to the surface of a substrate by screen printing, which also patterns the polymer, by curtain coating, by roller coating, or by the use of electrostatic spray. The patterning and curing processes employed with polymeric solder masks depend upon the type of polymer used as the solder mask. For example, photoimaging or mask and etch techniques may be employed to pattern the polymer, while the polymer may be cured by heat (for epoxies) or ultraviolet irradiation (for acrylates).

Solder may be applied to metal, dry film, or polymeric solder masks by known processes, such as by applying solder balls to the apertures of the solder mask, forcing solder paste into the apertures of the solder mask, by casting, or by ultrasonic dipping, wherein the masked substrate is immersed in molten solder, which then fills the apertures of the solder mask.

Following the deposition of solder to contact pads through a metal mask, the apertures of the metal mask must be larger than the cross-section of the solder bumps formed therethrough in order to facilitate removal and reuse of the metal solder mask. While dry film and polymeric solder masks dictate the contact location of a substrate upon which solder bumps are formed or applied, dry film and polymeric solder masks are typically very thin in order to facilitate their retention on or their removal from the substrate. Thus, the apertures of dry film and polymeric solder masks may not define the configuration of solder bumps; rather, dry film and polymeric solder masks are typically used to position spherical solder bumps on the contact pads of a substrate.

Spherical solder bumps and other configurations of relatively short, wide solder bumps may stress the adjacent semiconductor device. Such stress may be caused, for example, by the different coefficients of thermal expansion of the solder and the adjacent substrate or by conformational changes as the solder bump solidifies.

Thin polymeric films, such as adhesive tapes, have also been applied to printed circuit boards to be used as solder masks. U.S. Pat. No. 5,388,327 (hereinafter "the '327 Patent"), which issued to Trabucco on Feb. 14, 1995, and U.S. Pat. Nos. 5,497,938 (hereinafter "the '938 Patent") and 5,751,068 (hereinafter "the '068 Patent"), which issued to McMahon et al. on Mar. 12, 1996, and May 12, 1998, respectively, disclose adhesive films that carry preformed conductive bumps. The conductive bumps carried by the film are aligned with corresponding contact pads of a printed circuit board, the film is adhered to the printed circuit board, the conductive bumps are each secured to their corresponding contact pad, and the film is removed from the printed circuit board with a solvent. The use of such a carrier film is, however, somewhat undesirable since, during application of the film to the printed circuit board, air pockets may form between the film and the printed circuit board and a sufficient contact between one or more of the conductive bumps and their corresponding contact pads may not be established. Thus, the conductive bumps may not secure sufficiently to their corresponding contact pads on the printed circuit board to establish an adequate electrical connection with the contact pads. Moreover, the use of such an adhesive film to facilitate the disposal of solder bumps on a bare or minimally packaged semiconductor device is not disclosed in the '327 Patent, the '938 Patent, or the '068 Patent.

U.S. Pat. Nos. 5,442,852 (hereinafter "the '852 Patent"), 5,504,277 (hereinafter "the '277 Patent"), and 5,637,832 (hereinafter "the '832 Patent"), which issued to Danner on Aug. 22, 1995, Apr. 2, 1996, and Jun. 10, 1997, respectively, each disclose a solder mask that includes an adhesive film with an array of holes therethrough. In use, the holes through the film are aligned with corresponding contact pads of a printed circuit board. Solder balls are then disposed on the contact pads exposed through the holes of the film. The solder mask, however, has a thickness that is significantly less than the height of the solder balls. Thus, the adhesive film solder mask disclosed in the '852, '277, and '832 Patents may be employed to position the solder balls in desired locations, but does not include apertures that define the shape of the solder. Moreover, the use of such an adhesive film to facilitate the disposal of solder bumps on a bare or minimally packaged semiconductor device is not disclosed in the '852, '277, or '832 Patents.

Thus, there is a need for a reliable method of efficiently applying conductive structures, such as solder bumps, of desired configuration to the contact pads of semiconductor device substrates through a solder mask. There is also a need for a solder mask through which conductive structures of desired configuration can be reliably and efficiently applied to the contact pads of semiconductor device substrates, including bare or minimally packaged semiconductor dice.

SUMMARY OF THE INVENTION

The present invention includes a method of disposing solder bumps on a substrate, such as a bare or minimally packaged semiconductor device or a printed circuit board (e.g., the printed circuit board of a ball grid array ("BGA") package). The method of the present invention employs a solder mask comprising a dielectric film, such as a polymer, silicon oxide, glass (e.g., borophosphosilicate glass ("BPSG"), phosphosilicate glass ("PSG"), or borosilicate glass ("BSG")), or silicon nitride, with apertures formed therethrough. The present invention also includes solder masks that may be used in the inventive method, as well as semiconductor devices fabricated in accordance with the method of the present invention. As used herein, the term "solder mask" is expansive and not limiting, including structures for application of materials to substrates to form conductive elements, whether metallic or nonmetallic.

The method of the present invention includes aligning a film of dielectric material, such as a polymer, silicon oxide, glass, or silicon nitride, with a substrate, such as a bare or minimally packaged semiconductor device or a printed circuit board. The film may be preformed or formed during disposal thereof onto the substrate. The film has apertures formed therethrough, which are substantially aligned with contact pads of the substrate, such as the bond pads of a bare or minimally packaged semiconductor device or the terminals of a printed circuit board, so as to expose the contact pads through the solder mask. The apertures are configured to impart a solder bump formed therein with a desired configuration. Apertures may be formed in the solder mask prior to, during, or subsequent to disposal of the solder mask on the substrate.

Conductive material, such as solder, is applied to the contact pads of the substrate through the apertures of the solder mask. Solder may be applied to the contact pads by known techniques, such as by wave solder techniques, which are also referred to as thermosonic dipping, by evaporation, by plating, by screen printing, or by disposing solder balls in or adjacent the apertures of the solder mask. Other conductive materials, such as conductive elastomers, may alternatively be disposed in the apertures of the solder mask by known processes, such as by screen printing or disposing a quantity of the conductive material in or adjacent each of the apertures of the solder mask. The solder or other conductive material is molten as it is introduced into the apertures or thereafter. As the solder or other conductive material in the apertures of the solder mask becomes molten, conductive structures of the desired shape are substantially simultaneously formed in the apertures and secured to their corresponding contact pads.

When the formed conductive structures have adequately solidified, the solder mask may be substantially removed from the substrate. Depending upon the type of material employed as the solder mask, the solder mask may be removed by peeling the film from the substrate (e.g., if a polymer is used as the solder mask) by use of suitable solvents (e.g., if a polymer is used as the solder mask), by etching the film from the substrate (e.g., if a polymer, silicon oxide, glass, or silicon nitride is used as the solder mask), or otherwise, as known in the art. Alternatively, the thickness of the solder mask may be reduced to expose the sides, or peripheries, of the conductive structures. For example, if the solder mask is comprised of a polymeric material that may be shrunken when exposed to a certain chemical or chemicals, to a plasma, or to radiation, the solder mask may be shrunken to expose the sides, or peripheries, of the conductive structures formed therewith. As another example, the thickness of the solder mask may be reduced by etching the dielectric material.

One embodiment of a semiconductor device according to the present invention, which represents an intermediate point in the method of the present invention, includes a substrate having contact pads on an active surface thereof and a solder mask comprising a dielectric material disposed over the active surface. The solder mask has a thickness that is substantially the same as the desired height of the conductive structures to be formed with the solder mask. The solder mask also includes apertures through which selected ones of the contact pads are exposed and into which conductive material is disposable. Thus, the conductive structures of the semiconductor device have not yet been exposed by removing or reducing the thickness of the solder mask. In one variation, the substrate is a bare or minimally packaged semiconductor die and the contact pads are the bond pads of the semiconductor die. In another variation, the substrate is a printed circuit board and the contact pads are the terminals of the printed circuit board.

In another embodiment of a semiconductor device according to the present invention, a solder mask made of dielectric material is disposed on an active surface of a substrate. The thickness of the solder mask is reduced (e.g., the layer is shrunken or etched). Conductive structures are secured to and communicate electrically with the contact pads of the substrate, extend through apertures of the reduced-thickness solder mask, and protrude from the solder mask. In one variation, the substrate is a bare or minimally packaged semiconductor die and the contact pads are the bond pads of the semiconductor die. In another variation, the substrate is a printed circuit board and the contact pads are the terminals of the printed circuit board.

Other features and advantages of the present invention will become apparent to those of ordinary skill in the art through consideration of the ensuing description, the accompanying drawings, and the appended claims.

DETAILED DESCRIPTION OF THE INVENTION

Figure 1:
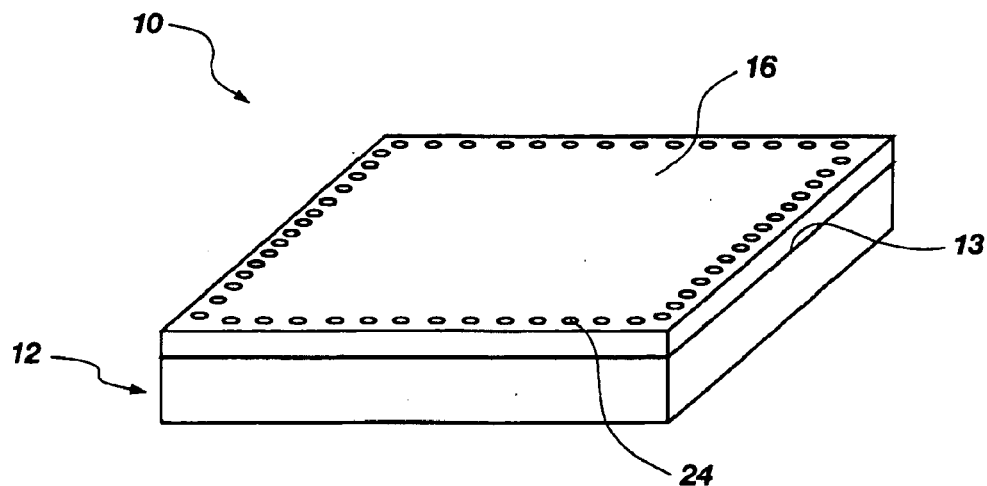
FIG. 1 is a perspective schematic representation of a semiconductor device according to the present invention.

With reference to FIG. 1, a semiconductor device 10 according to the present invention, which includes a substrate 12 with integrated circuitry thereon and contact pads 14 (see FIGS. 2–8) in electrical communication with the integrated circuitry is illustrated. As depicted, substrate 12 is a semiconductor die and contact pads 14 are the bond pads of the semiconductor die. Typically and conventionally, the bond pads, when used with a tin/lead solder, may be coated with a plurality of superimposed metal layers to enhance the bonding of the solder to the metal of the bond pad. Further, contact pads may be offset from the bond pads and connected thereto by circuit traces extending over the active surface so as to rearrange an input/output pattern of bond pads to a pattern more suitable for an array of conductive bumps. Semiconductor device 10 also includes a solder mask 16 comprised of dielectric material disposed over an active surface 13 of substrate 12. Solder mask 16 includes apertures 18 aligned substantially over contact pads 14. Conductive structures 24 are disposed in apertures 18 so as to communicate electrically with their corresponding contact pads 14 exposed to apertures 18. As used herein, the term "semiconductor die" encompasses partial and full wafers as well as other nonwafer-based substrates, including, by way of example only, silicon on sapphire ("SOS"), silicon on glass ("SOG") and, in general, silicon on insulator ("SOI") substrates.

While semiconductor device 10 is depicted as including a semiconductor die, solder masks and conductive structures within the scope of the present invention may also be disposed on other types of substrates, such as printed circuit boards and other substrates with electrical circuitry and electrical contact pads thereon.

Figure 2:
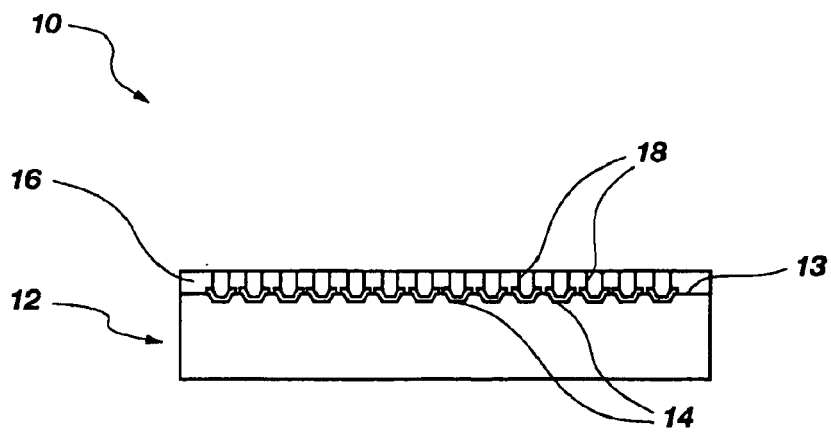
FIG. 2 is a cross-sectional representation illustrating the placement of a solder mask on a semiconductor device.

An exemplary method for fabricating semiconductor device 10 is illustrated in FIGS. 2–4B. FIG. 2 illustrates the alignment of a solder mask 16 with features on active surface 13 of substrate 12 and the disposal of solder mask 16 on active surface 13. Specifically, apertures 18 through solder mask 16 are substantially aligned with corresponding contact pads 14 on active surface 13. Thus, contact pads 14 are each exposed through their corresponding aperture 18.

As an example of the manner in which solder mask 16 may be disposed on active surface 13, a solder mask 16 comprising a film of a dielectric material with preformed apertures 18 therethrough may be aligned with the features of active surface 13, such as contact pads 14, and secured (e.g., by a pressure sensitive adhesive) to active surface 13. Preferably, the material from which solder mask 16 is made is a nonconductive polymer, such as a polyimide, that withstands the temperatures of the molten conductive materials, such as solders (e.g., temperatures from about 190° C. to about 260° C.) or conductive elastomers, to be disposed within apertures 18 without undergoing substantial conformational changes and without substantially degrading. Alternatively, solder mask 16 can be made of other dielectric materials, such as silicon oxide, glass (e.g., BPSG, PSG, or BSG), or silicon nitride. Apertures 18 may be preformed through the film of dielectric material by known laser ablation or laser drilling processes, by known mask and etch processes, or by other known micron-scale and submicron-scale processes for patterning the particular dielectric material employed as solder mask 16.

Alternatively, a layer of photoimageable polymeric material, such as a photoimageable polyimide, may be disposed on active surface 13 by known processes, such as by spin-on techniques, by curtain coating, by roller coating or by use of electrostatic spray. Solder mask 16 and the apertures 18 therethrough may then be formed from the layer of photoimageable material by known photoimaging processes, thereby substantially exposing contact pads 14 to apertures 18 and through solder mask 16. Again, the photoimageable polymeric material preferably withstands the temperatures of molten conductive material (e.g., solders, metals, and metal alloys) to be disposed within apertures 18 without undergoing substantial conformational changes or substantial degradation.

As another alternative, solder mask 16 may be fabricated by disposing a layer of dielectric material, such as a non-photoimageable polyimide, silicon oxide, glass, or silicon nitride, on active surface 13 of substrate 12 by known processes. For example, known spin-on techniques may be employed to form layers of polymeric material and glass on active surface 13. As another example, layers of polymeric material may also be disposed on active surface 13 by curtain coating, by roller coating, by use of electrostatic spray, or by screen printing, which also patterns the layer of polymeric material substantially simultaneously with disposing the polymeric material on active surface 13. Known chemical vapor deposition ("CVD") techniques may be employed to dispose a layer of silicon oxide, glass, or silicon nitride on active surface 13.

Apertures 18 may be formed through the dielectric material by known processes, such as by disposing a photomask over regions of the layer of dielectric material that are to remain on active surface 13 and by removing the dielectric material located above contact pads 14 through holes in the photomask. For example, known isotropic (e.g., wet chemical etching) and anisotropic, or dry, etch processes, such as barrel plasma etching ("BPE") and reactive ion etching ("RIE") processes, may be employed to form apertures 18 through a layer of polymeric material. Etching processes may likewise be used to form apertures 18 through silicon oxide, glass, and silicon nitride solder masks 16.

Figure 3:
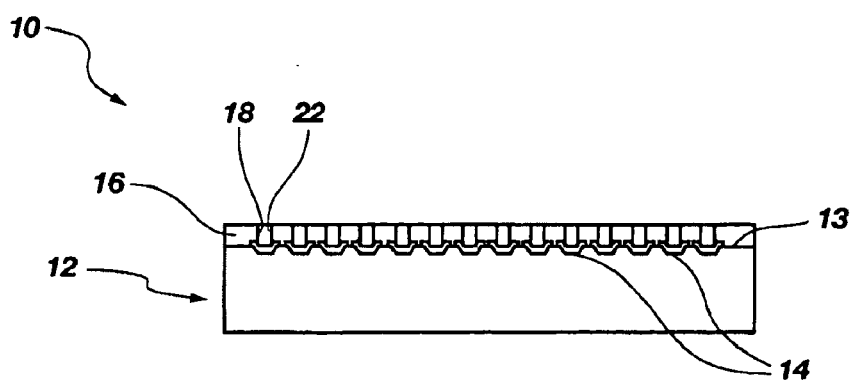
FIG. 3 is a cross-sectional representation illustrating the disposal of conductive material in the apertures of the solder mask of FIG. 2.

With reference to FIG. 3, a quantity of conductive material 22 is then disposed within each aperture 18 of solder mask 16. Conductive material 22 may be disposed within apertures 18 in molten or liquid form, as a powder, or as a paste. If solder, such as a tin/lead solder, is employed as conductive material 22, known processes may be employed to apply flux and the solder to the exposed surface of solder mask 16 and to dispose the solder within apertures 18. For example, known wave solder processes or solder ball disposition techniques may be employed to dispose the conductive material 22 into apertures 18. While in apertures 18, conductive material 22 is liquified, which permits conductive material 22 to substantially fill each aperture 18. As the conductive material solidifies, it bonds to the portions of contact pads 14 exposed through apertures 18, forming conductive structures 24 that are electrically linked to each of the contact pads 14 exposed to apertures 18. The shape of each conductive structure 24 is determined by the shape of the aperture 18 in which conductive structure 24 was formed.

Alternatively, other types of conductive materials, such as z-axis and other conductive or conductor-filled elastomers, other metals, and metal alloys, may be similarly disposed within apertures 18 and in contact with contact pads 14 to form conductive structures 24. If a conductive elastomer is employed as the conductive material 22 used to form conductive structures 24, the conductive elastomer will preferably not adhere substantially to or diffuse substantially into adjacent regions of the material of solder mask 16.

Figure 4A:
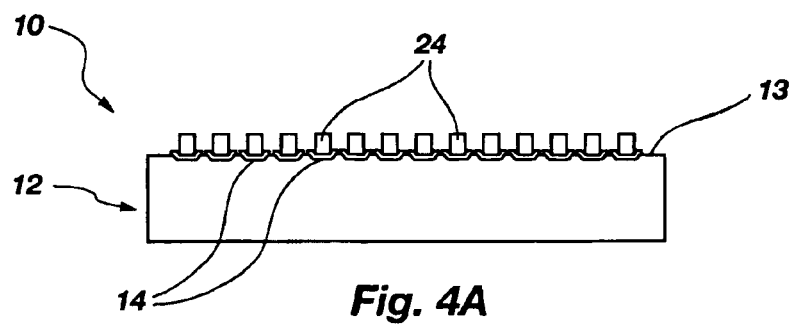
FIG. 4A is a cross-sectional representation illustrating the removal of the solder mask of FIG. 3 from the semiconductor device to expose the conductive structures on the contact pads of the semiconductor device.

Referring now to FIG. 4A, a method of exposing the sides, or peripheries, of conductive structures 24 is illustrated. Once conductive structures 24 have been formed on contact pads 14, solder mask 16 may be removed from active surface 13 of substrate 12. Solder mask 16 may be peeled from active surface 13, removed therefrom by use of a suitable solvent, such as antimony trichloride when solder mask 16 is fabricated from a polyimide material, or etched from active surface 13 by known processes. If an etchant is employed to remove solder mask 16, the etchant preferably removes the material of solder mask 16 with selectivity over conductive material 22 of conductive structures 24. If an elastomeric conductive material is employed to fabricate conductive structures 24, the technique by which solder mask 16 is removed from active surface 13 preferably does not substantially affect the configurations of the elastomeric conductive structures 24.

Figure 4B:
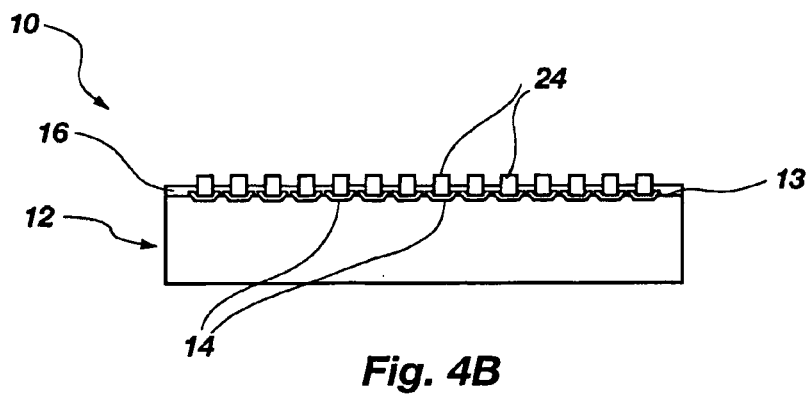
FIG. 4B is a cross-sectional representation illustrating a reduction in the thickness of the solder mask of FIG. 3 to expose the conductive structures on the contact pads of the semiconductor device.

FIG. 4B illustrates a method of exposing the sides, or peripheries, of conductive structures 24 by reducing the thickness of solder mask 16 relative to the height of conductive structures 24. The thickness of solder mask 16 may be reduced by use of a suitable solvent or by etching the material of solder mask 16. If an etchant is employed to reduce the thickness of solder mask 16, the etchant preferably removes the material of solder mask 16 with selectivity over conductive material 22 of conductive structures 24.

Alternatively, other means of reducing the thickness of solder mask 16 may also be employed, such as shrinking a polymeric solder mask 16 with an oxygen plasma, with another type of plasma, with chemical shrinking agents, or by exposing solder mask 16 to radiation. An exemplary method of shrinking small spheres made of polystyrene, polydivinylbenzene, or polytoluene is disclosed in U.S. Pat. No. 5,510,156, which issued to Zhao on Apr. 23, 1996, the disclosure of which is hereby incorporated herein by this reference in its entirety. If an elastomeric material is employed to fabricate conductive structures 24, the technique by which the thickness of solder mask 16 is reduced preferably does not substantially affect the configurations of the elastomeric conductive structures 24.

Although FIGS. 2–4B illustrate substantially cylindrically configured conductive structures 24, conductive structures of other shapes are also within the scope of the present invention. FIGS. 5–8 illustrate some alternatively configured conductive structures that may be fabricated in accordance with the method of the present invention.

Figure 5:
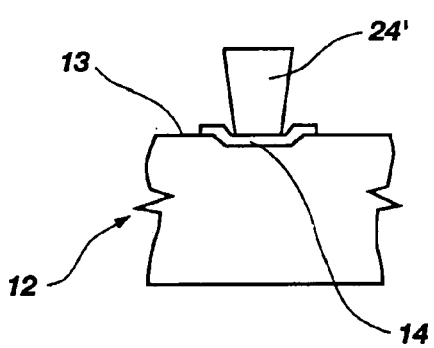
FIG. 5 is a cross-sectional representation illustrating a variation of the configuration of a solder bump fabricated by the method of the present invention.

With reference to FIG. 5, a conductive structure 24' that tapers inward from the top portion thereof toward contact pad 14 is shown. Thus, the portion of conductive structure 24' adjacent to contact pad 14 is the narrowest portion of conductive structure 24'. The aperture 18 (see FIGS. 2–4B) within which conductive structure 24' is formed may be defined through solder mask 16 by known processes, such as isotropic etching processes, that will provide an aperture 18 having a configuration complementary to that of conductive structure 24'.

Figure 6:
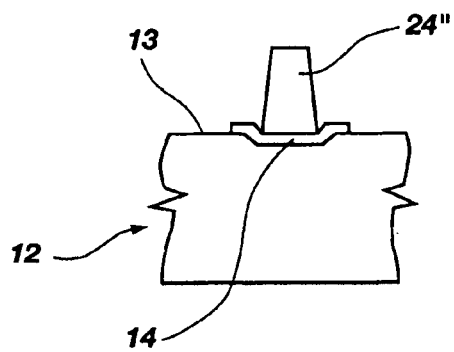
FIG. 6 is a cross-sectional representation illustrating a second variation of the configuration of a solder bump fabricated by the method of the present invention.

FIG. 6 illustrates a conductive structure 24" that tapers outward from the top portion thereof toward contact pad 14. As illustrated, the thickest portion of conductive structure 24" is adjacent to contact pad 14, while the narrowest portion of conductive structure 24" is the top thereof. The aperture 18 (see FIGS. 2–4B) within which conductive structure 24" is formed may be defined through solder mask 16 by known processes, such as isotropic etching processes, that will provide an aperture 18 having a configuration complementary to that of conductive structure 24".

Figure 7:
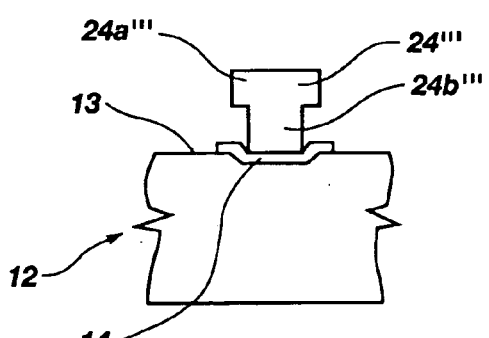
FIG. 7 is a cross-sectional representation illustrating a third variation of the configuration of a solder bump fabricated by the method of the present invention.

FIG. 7 illustrates a conductive structure 24''' with an upper portion 24a''' having a transverse cross section taken along the height of upper portion 24a''' of substantially uniform configuration. A lower portion 24b''' of conductive structure 24''' is located between contact pad 14 and upper portion 24a'''. The transverse cross section taken along the height of lower portion 24b''' also has a substantially uniform configuration. Lower portion 24b''' has a smaller transverse cross section than upper portion 24a'''. The aperture 18 (see FIGS. 2–4B) within which conductive structure 24b''' is formed may be defined by disposing a photomask of the type disclosed in U.S. Pat. No. 5,741,624, which issued to Jeng et al. on Apr. 21, 1998, the disclosure of which is hereby incorporated herein in its entirety by this reference. Material of the solder mask 16 may then be removed by known etching processes through holes in the photomask to define stepped apertures 18 over contact pads 14.

Figure 8:
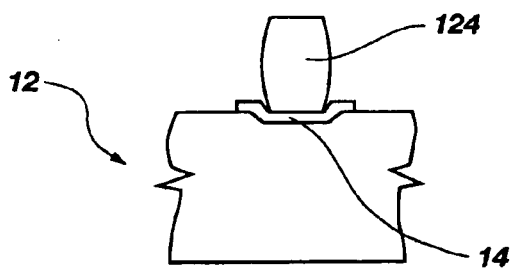
FIG. 8 is a cross-sectional representation illustrating a fourth variation of the configuration of a solder bump fabricated by the method of the present invention.

Turning to FIG. 8, another conductive structure 124 is illustrated. Conductive structure 124 has an outwardly curved center portion, which is thicker than the ends of conductive structure 124. Known processes, such as isotropic etching techniques, may be employed to form apertures 18 through solder mask 16 (see FIGS. 2–4B) within which conductive structure 124 may be formed.

Figure 9:
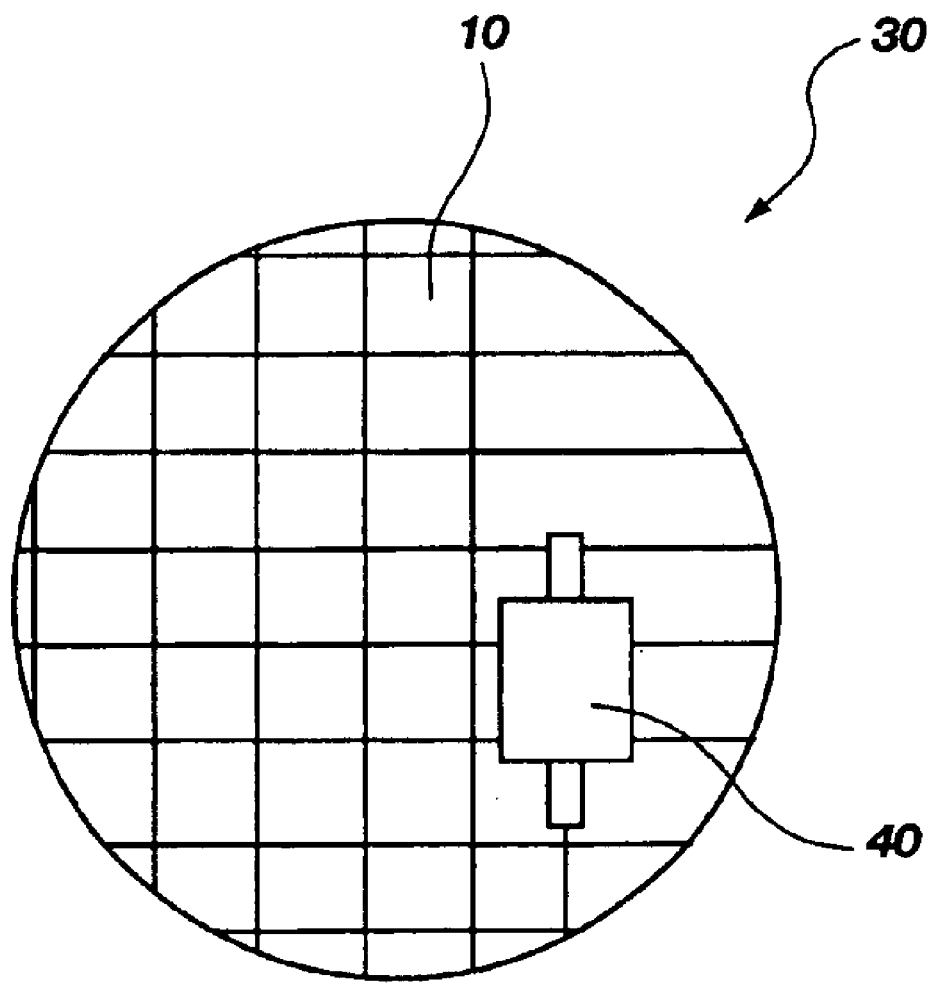
FIG. 9 is a schematic representation, in perspective view, of a semiconductor wafer including a plurality of unsingulated, conductively bumped semiconductor dice.

Of course, solder masks 16 having different shapes of apertures 18, as well as solder masks 16 having apertures 18 with combinations of different shapes, are also within the scope of the present invention. Accordingly, the present invention also includes semiconductor devices with combinations of different shapes of conductive structures on the contact pads thereof FIG. 9 illustrates that the above-described processes may be employed to form conductive structures on substrates 12 (FIGS. 1–8), in this case semiconductor dice, before the semiconductor dice have been singulated from a semiconductor wafer 30. Accordingly, semiconductor wafers 30 including a plurality of unsingulated, conductively bumped substrates 12 are also within the scope of the present invention. Individual conductively bumped semiconductor devices 10 may subsequently be singulated from semiconductor wafer 30 by known singulation processes, such as by the use of a wafer saw 40.

Although the foregoing description contains many specifics and examples, these should not be construed as limiting the scope of the present invention, but merely as providing illustrations of some of the presently preferred embodiments. Similarly, other embodiments of the invention may be devised which do not depart from the spirit or scope of the present invention. The scope of this invention is, therefore, indicated and limited only by the appended claims and their legal equivalents, rather than by the foregoing description. All additions, deletions and modifications to the invention as disclosed herein and which fall within the meaning of the claims are to be embraced within their scope.

What is claimed is:

1. A method of disposing a conductive structure on at least one contact pad on an active surface of a semiconductor device substrate, comprising:

disposing a layer comprising polymeric material over the substrate;

imparting said layer with a thickness substantially equal to a desired height of the conductive structure;

forming at least one aperture through said layer to expose at least a portion of the at least one contact pad;

disposing a quantity of conductive material on said layer and permitting said conductive material to substantially fill said at least one aperture;

bonding said conductive material within said at least one aperture to the at least one contact pad to form the conductive structure of substantially said desired height; and partially exposing a lateral periphery of the conductive structure through said layer.

2. The method of claim 1, wherein said disposing said quantity of conductive material on said layer comprises disposing a quantity of substantially molten conductive material on said layer.

3. The method of claim 2, wherein said bonding is effected as said quantity of substantially molten conductive material solidifies in said at least one aperture.

4. The method of claim 1, wherein said disposing said layer comprises adhering a film to a surface of the substrate.

5. The method of claim 1, wherein said disposing said layer comprises placing a quantity of polymeric material on the substrate and wherein said imparting comprises spreading said polymeric material to a substantially consistent thickness over at least a portion of a surface of the substrate.

6. The method of claim 1, wherein said forming said at least one aperture occurs prior to said disposing said layer over the substrate.

7. The method of claim 1, wherein said forming said at least one aperture comprises etching said at least one aperture through said layer.

8. The method of claim 7, wherein said etching occurs following said disposing said layer over the substrate.

9. The method of claim 1, wherein said partially exposing said lateral periphery of the conductive structure comprises reducing said thickness of said layer.

10. The method of claim 9, wherein said reducing said thickness comprises partially etching said layer.

11. The method of claim 9, wherein said reducing said thickness comprises shrinking said layer.

12. The method of claim 11, wherein said shrinking comprises exposing said layer to radiation, exposing said layer to a shrinking agent, or exposing said layer to a plasma.

13. The method of claim 1, wherein said partially exposing said lateral periphery comprises exposing said layer to a solvent.

14. The method of claim 1, wherein said disposing said quantity of conductive material comprises immersing a surface of the substrate having said layer disposed thereon within a quantity of molten conductive material.

15. The method of claim 1, wherein said disposing said quantity of conductive material comprises disposing solder on said layer.

16. The method of claim 1, wherein said disposing said quantity of conductive material comprises disposing conductive elastomer on said layer.

17. The method of claim 1, wherein said forming said at least one aperture comprises exposing a portion of said at least one contact pad located within a periphery thereof.

18. A method of forming a solder mask, comprising:

disposing a solder mask material comprising a polymer onto an active surface of a substrate;

forming a layer of said solder mask material having a substantially consistent thickness on the active surface of said substrate, said thickness of said layer being substantially equal to a desired conductive structure height; and forming at least one aperture through said layer in a location corresponding to a location of at least one contact pad of said substrate to expose said at least one contact pad through said solder mask material, said solder mask material facilitating a partial reduction in said thickness when a conductive structure has been at least partially formed in said at least one aperture.

19. The method of claim 18, wherein said disposing and said forming said layer are effected substantially simultaneously.

20. The method of claim 18, wherein said forming said layer comprises planarizing said layer.

21. The method of claim 18, wherein said forming said layer comprises softening or melting said solder mask material.

22. The method of claim 21, wherein said forming said layer comprises spinning said solder mask material over said active surface.

23. The method of claim 21, wherein said forming said layer comprises spreading said solder mask material across said active surface.

24. The method of claim 18, wherein said forming said at least one aperture comprises etching a region of said layer.

25. The method of claim 18, wherein said solder mask material comprises a photosensitive polymeric material and wherein said forming said at least one aperture comprises exposing a region of said photosensitive polymeric material disposed over said at least one contact pad to form said at least one aperture through said layer.

26. A method of exposing at least a portion of a lateral periphery of a conductive structure on a semiconductor device, comprising partially reducing a thickness of a solder mask that comprises polymeric material disposed around said lateral periphery.

27. The method of claim 26, wherein said reducing said thickness comprises irradiating said solder mask, exposing said solder mask to a plasma, or exposing said solder mask to a shrinking agent.

28. The method of claim 26, wherein said reducing said thickness comprises selectively etching a material of said solder mask with respect to the conductive structure.

29. A method of exposing a conductive structure that protrudes from a surface of a semiconductor device through a solder mask that comprises a polymeric material positioned on the surface of the semiconductor device, comprising:

partially reducing a thickness of at least portions of the solder mask laterally surrounding the conductive structure.

30. The method of claim 29, wherein said partially reducing comprises reducing a thickness of substantially all of the solder mask.

31. The method of claim 29, wherein said partially reducing comprises exposing the solder mask to at least one of radiation, a plasma, and a shrinking agent.

32. The method of claim 29, wherein said partially reducing comprises removing a material of the solder mask with selectivity over a material of the conductive structure.

33. The method of claim 32, wherein said removing comprises etching the material of the solder mask with selectivity over the material of the conductive structure.

* * * * *